United States Patent
Wu

(10) Patent No.: US 9,716,494 B1
(45) Date of Patent: Jul. 25, 2017

(54) FREQUENCY-TO-VOLTAGE CONVERTER

(71) Applicant: I-SHOU UNIVERSITY, Kaohsiung (TW)

(72) Inventor: Rong-Ching Wu, Kaohsiung (TW)

(73) Assignee: I-SHOU UNIVERSITY, Kaohsiung (TW)

( * ) Notice: Subject to any disclaimer, the term of this patent is extended or adjusted under 35 U.S.C. 154(b) by 0 days.

(21) Appl. No.: 15/197,173

(22) Filed: Jun. 29, 2016

(30) Foreign Application Priority Data

Apr. 19, 2016 (TW) .............................. 105112190 A

(51) Int. Cl.
*H03D 3/00* (2006.01)
*H03K 7/06* (2006.01)

(52) U.S. Cl.
CPC ...................................... *H03K 7/06* (2013.01)

(58) Field of Classification Search
CPC ...................................................... H03K 7/06
See application file for complete search history.

(56) References Cited

U.S. PATENT DOCUMENTS 3,740,633 A * 6/1973 Buttafava ............. G01P 3/4802
324/175

* cited by examiner

*Primary Examiner* — Daniel Puentes
(74) *Attorney, Agent, or Firm* — WPAT, P.C., Intellectual Property Attorneys; Anthony King

(57) ABSTRACT

A, a frequency-to-voltage converter including a calculation module, a quantification module and a signal processing module is disclosed. The calculation module receives a frequency signal and calculates a rotational speed signal according to the frequency signal. The quantification module is coupled with the calculation module and receives the rotational speed signal. The quantification module quantifies the rotational speed signal according to a quantification equation and generates a digital quantified signal. The signal processing module is coupled with the quantification module, receives the digital quantified signal, and converts the digital quantified signal into a digital voltage signal. As such, the proper transition time and ripple magnitude can be endured at the same time.

9 Claims, 1 Drawing Sheet

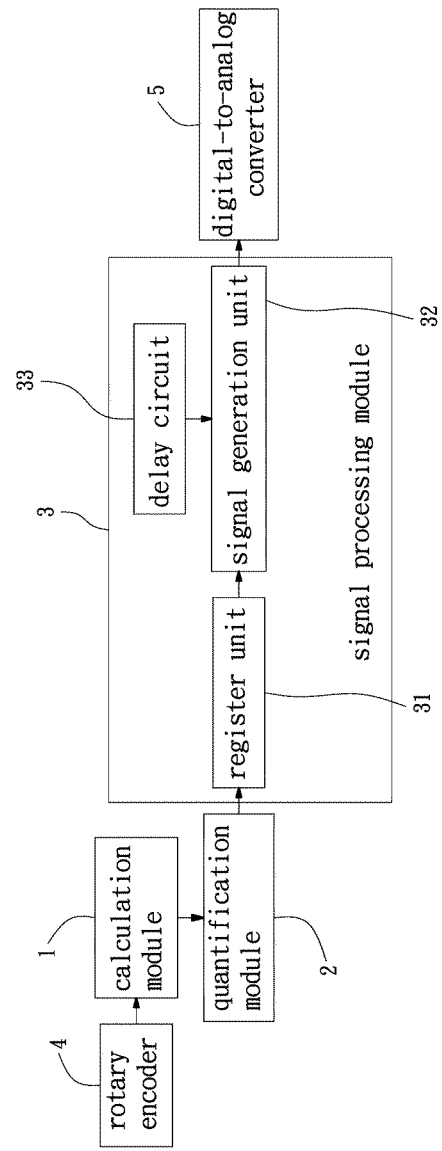

FREQUENCY-TO-VOLTAGE CONVERTER

CROSS REFERENCE TO RELATED APPLICATIONS

The application claims the benefit of Taiwan application serial No. 105112190, filed on Apr. 19, 2016, and the subject matter of which is incorporated herein by reference.

BACKGROUND OF THE INVENTION

1. Field of the Invention

The present disclosure generally relates to a frequency-to-voltage converter and, more particularly, to a frequency-to-voltage converter without a low pass filter circuit.

2. Description of the Related Art

A frequency-to-voltage converter can receive and convert a pulse-type of frequency signal into a voltage signal in positive correlation. The frequency-to-voltage converter can be widely used in some fields such as rotational speed measurement and mechanical control. For example, when the frequency-to-voltage converter receives a frequency signal of a rotating electric motor, the generated voltage signal can be used not only to represent the rotational speed of the electric motor, but also to serve as a control signal of the electric motor.

A conventional frequency-to-voltage converter generally includes a comparator circuit, an intergrator circuit and a low pass filter circuit. When the comparator circuit receives the frequency signal, the comparator circuit can be triggered by the pulses of the frequency signal to continuously generate a triggering signal. The intergrator circuit can be triggered by the triggering signal to generate the voltage signal. Since the voltage signal of the intergrator circuit is analogous, the voltage signal should be filtered by the low pass filter circuit to reduce the ripple of the voltage signal, so as to increase the accuracy in retrieving the voltage signal.

Generally, the low pass filter circuit is formed by resistors and capacitors for performing the filtering function. The resistors and capacitors have a time constant. If the time constant is large, the low pass filter circuit will have a better performance. However, the overall transition time will be adversely longer. As a result, the voltage signal will not be able to instantly reflect the change of the rotational speed of the electric motor. To the contrary, if the time constant is small, the transition time will be shorter but the ripple will be larger. This causes an inaccurate voltage value of the voltage signal.

In light of the disadvantage of the conventional frequency-to-voltage converter where it is difficult to ensure proper transition time and ripple magnitude at the same time, it is necessary to provide a novel frequency-to-voltage converter which is able to do so.

SUMMARY OF THE INVENTION

It is therefore the objective of this disclosure to provide a frequency-to-voltage converter which quantifies the signal during the signal processing in order to output a non-analogous voltage signal. As such, there is no need to arrange a low pass filter circuit and proper transition time and ripple magnitude can be ensured.

In an embodiment of the disclosure, a frequency-to-voltage converter including a calculation module, a quantification module and a signal processing module is disclosed. The calculation module receives a frequency signal and to calculate a rotational speed signal according to the frequency signal. The quantification module is coupled with the calculation module and receives the rotational speed signal. The quantification module quantifies the rotational speed signal according to a quantification equation and generates a digital quantified signal. The signal processing module is coupled with the quantification module, receives the digital quantified signal, and converts the digital quantified signal into a digital voltage signal. As such, the rotational speed signal can be quantified by the quantification module, such that the signal processing module can generate the digital voltage signal. The digital voltage signal does not need to be filtered by any low pass filter circuit. Thus, the overall transition time and the ripple magnitude will not be affected by the low pass filter circuit, advantageously ensuring the proper transition time and ripple magnitude at the same time.

In a form shown, the frequency-to-voltage converter further includes a rotary encoder coupled with the calculation module. The rotary encoder detects the rotation of a rotor of an electric motor and to generate the frequency signal having a plurality of pulses. As such, the frequency-to-voltage converter according to the embodiment of the disclosure is able to generate the frequency signal based on the rotation of the rotor and to perform a data processing on the frequency signal to generate the digital voltage signal. The digital voltage signal can be used not only to represent the rotational speed of the electric motor, but also to serve as a control signal of the electric motor. Thus, the utility is improved.

In the form shown, the frequency-to-voltage converter further includes a digital-to-analog converter coupled with the signal processing module, receiving the digital voltage signal from the signal processing module, converting the digital voltage signal into an analogous voltage signal, and outputting the analogous voltage signal. Based on this, the voltage signal can have an analogous form. Since the voltage signal has been quantified, the analogous voltage signal does not need to be filtered by any low pass filter circuit. Thus, the analogous voltage signal can be directly used in an electric device that requires an analogous supply voltage, improving the utility thereof.

In the form shown, the quantification equation is expressed as:

$$n' = \frac{C}{n_{max}} \times n.$$

n' represents the digital quantified signal, n represents the rotational speed signal, $n_{max}$ represents a predicted maximum value of the rotational speed signal, and "C" represents a constant. As such, the quantified signal can have the digital form through the quantification process of the quantification module. When the digital quantified signal is processed in a later stage, it will not require any low pass filter circuit to filter the digital quantified signal. Therefore, the proper transition time and ripple magnitude can be ensured at the same time.

In the form shown, the signal processing module includes a register unit and a signal generation unit coupled with the register unit. The register unit receives and stores the digital quantified signal. The signal generation unit retrieves the digital quantified signal from the register unit, and converts the digital quantified signal into the digital voltage signal. As such, the register unit may store the digital quantified signal temporarily, avoiding the loss of the digital quantified signal during which the digital quantified signal is transmitted from the quantification module to the signal generation unit. The normal signal processing can be ensured.

In the form shown, the signal processing module further includes a delay circuit coupled with the signal generation unit. The delay circuit has a delay time. The delay circuit controls the signal generation unit to retrieve the digital quantified signal from the register unit based on the delay time. As such, it can be ensured that the signal generation unit properly retrieves the data from the register unit, maintaining the normal signal processing.

In the form shown, the register unit has a sampling rate which is a reciprocal of the delay time. As such, it can be ensured that the signal generation unit properly retrieves the data from the register unit, maintaining the normal signal processing.

In the form shown, each of the plurality of pulses is a square wave having a rising edge, and the calculation module calculates the rotational speed signal based on a time difference between the rising edges of two adjacent square waves of the frequency signal. As such, the calculation module can calculate and generate the rotational speed signal according to a single cycle of pulse of the frequency signal, and it simply takes a cycle of a single pulse of time to calculate the rotational speed signal. Thus, the calculation of the rotational speed signal is fast and accurate.

BRIEF DESCRIPTION OF THE DRAWINGS

The present disclosure will become more fully understood from the detailed description given hereinafter and the accompanying drawings which are given by way of illustration only, and thus are not limitative of the present disclosure, and wherein:

The sole FIGURE shows a block diagram of a frequency-to-voltage converter according to an embodiment of the disclosure.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the disclosure.

DETAILED DESCRIPTION OF THE INVENTION

FIG. 1 shows a block diagram of a frequency-to-voltage converter according to an embodiment of the disclosure. The frequency-to-voltage converter includes a calculation module 1, a quantification module 2 and a signal processing module 3. The quantification module 2 is coupled with the calculation module 1, and the signal processing module 3 is coupled with the quantification module 2.

The calculation module 1 is used to receive a frequency signal and to calculate a rotational speed signal according to the frequency signal. The calculation module 1 may be a processor or an integrated circuit (IC) which is able to perform the operations such as data calculation and logic decision. The frequency signal may be a signal of a rotating rotor of an electric motor. The manner in which the calculation module 1 generates the rotational speed signal based on the frequency signal is not limited herein. For example, the frequency signal may have a plurality of pulses. If each pulse is in the form of a square wave, the calculation module 1 may calculate the rotational speed signal based on the time difference between the rising edges of two adjacent square waves. As such, the calculation module 1 can calculate and generate the rotational speed signal according to a single cycle of pulse of the frequency signal, and it simply takes a cycle of a single pulse of time to calculate the rotational speed signal. Thus, the calculation of the rotational speed signal is fast and accurate.

The quantification module 2 is coupled with the calculation module 1 in order to receive the rotational speed signal. Then, the quantification module 2 quantifies the rotational speed signal according to a quantification equation and generates a digital quantified signal. The signal processing module 3 may be a processor or an integrated circuit which can perform the operations such as data calculation and logic decision.

Specifically, since the frequency signal is in an analogous form, when the calculation module 1 calculates the rotational speed signal based on the frequency signal, the generated rotational speed signal is also analogous. After the quantification module 2 receives the rotational speed signal, the quantification module 2 can quantify the rotational speed signal via the quantification equation, thereby generating a digital quantified signal. The quantification equation is expressed as:

$$n' = \frac{C}{n_{max}} \times n. \quad (1)$$

In equation (1), n' represents the quantified signal, n represents the rotational speed signal, $n_{max}$ represents a predicted maximum value of the rotational speed signal n, which can be an arbitrary integer. The parameter "C" represents a constant, which may be $2^8$ in the embodiment.

The digital quantified signal may be generated through the processing of the quantification module 2. When the quantified signal is processed in a later stage, it will not require any low pass filter circuit to filter the quantified signal. Therefore, the overall transition time and the ripple magnitude will not be affected by the low pass filter circuit, advantageously ensuring the proper transition time and ripple magnitude at the same time.

The signal processing module 3 is coupled with the quantification module 2 to receive the quantified signal, and converts the quantified signal into a digital voltage signal. The signal processing module 3 may be a processor or an integrated circuit, and can perform the operations such as data calculation and logic decision. Alternatively, among the calculation module 1, the quantification module 2 and the signal processing module 3, any two or all of them can be integrated into the same processor or integrated circuit. The disclosure is not limited to either option. The manner in which the processing module 3 converts the quantified signal into the voltage signal is not limited herein. For example, based on the value of the quantified signal, the quantified signal can be converted into the voltage signal having a corresponding value. As such, the signal processing module 3 may output the digital voltage signal. The voltage signal does not need to be filtered by any low pass filter circuit. Thus, the overall transition time and the ripple magnitude will not be affected by the low pass filter circuit, advantageously ensuring the proper transition time and ripple magnitude at the same time.

In the embodiment, the signal processing module 3 may include a register unit 31 and a signal generation unit 32 coupled with the register unit 31. The register unit 31 receives and stores the quantified signal. The signal generation unit 32 retrieves the quantified signal from the register unit 31, and converts the quantified signal into the digital voltage signal. As such, the register unit 31 may store the quantified signal temporarily, avoiding the loss of the quantified signal during which the quantified signal is transmitted from the quantification module 2 to the signal generation unit 32. As such, the normal signal processing can be ensured.

Based on the arrangement of the register unit 31 and the signal generation unit 32, the signal processing module 3 may further include a delay circuit 33 coupled with the signal generation unit 32. The delay circuit 33 has a delay time. Under the control of the delay circuit 33, the signal generation unit 32 retrieves the quantified signal from the register unit 31 based on the delay time. The register unit 31 has a sampling rate so that the register unit 31 may update and store the quantified signal according to the sampling rate. The sampling rate is a reciprocal of the delay time.

For example, the sampling rate of the register unit 31 may be 128 (times per second). As such, the register unit 31 may update and store the quantified signal 128 times in one second. Then, the delay time of the delay circuit 33 may be $1/128$ second, and the delay circuit 33 can control the signal retrieval of the signal generation unit 32 under the delay time. As such, the signal generation unit 32 retrieves the register unit 31 in every $1/128$ second. Based on the arrangement of the delay circuit 33, the sampling rate and the delay time, it can be ensured that the signal generation unit 32 properly retrieves the data from the register unit 31, maintaining the normal signal processing.

Furthermore, the frequency-to-voltage converter of the embodiment of the disclosure may further include a rotary encoder 4. The rotary encoder 4 is coupled with the calculation module 1. The rotary encoder 4 is used to detect the rotation of the rotor and generates the pulse-type of frequency signal. The rotary encoder 4 may be an absolute-type encoder or an incremental-type encoder. The rotary encoder 4 may obtain the rotation information of the rotor through pulse detection or optical induction, and then generates the pulse-type of frequency signal according to the rotation information. When the frequency signal is sent to the calculation module 1, the subsequent data processing can be performed. Through the arrangement of the rotary encoder 4, the frequency-to-voltage converter according to the embodiment of the disclosure is able to generate the frequency signal according to the rotation of the rotor of the electric motor, and performs the data processing on the frequency signal to generate the voltage signal. The voltage signal can be used not only to represent the rotational speed of the electric motor, but also to serve as a control signal of the electric motor. Thus, the utility is improved.

Moreover, the frequency-to-voltage converter according to the embodiment of the disclosure may further include a digital-to-analog converter 5. The digital-to-analog converter 5 is coupled with the signal processing module 3 to receive the voltage signal therefrom. The digital-to-analog converter 5 converts the voltage signal from digital to analogous form, and outputs the analogous voltage signal. The digital-to-analog converter 5 may be an "R-2R" type digital-to-analog converting circuit. Based on this, when the digital-to-analog converter according to the embodiment of the disclosure includes the digital-to-analog converter 5, the voltage signal can be output in an analogous form. Since the voltage signal has been quantified, the analogous voltage signal does not need to be filtered by any low pass filter circuit. Thus, the voltage signal can be directly used in an electric device that requires an analogous supply voltage, improving the utility thereof.

In conclusion, the digital-to-analog converter according to the embodiment of the disclosure can perform a quantification process on the signal via the quantification module. As such, the signal processing module can generate the digital voltage signal, in which the voltage signal does not need to be filtered by any low pass filter circuit. As such, the proper transition time and ripple magnitude can be ensured at the same time.

Although the disclosure has been described in detail with reference to its presently preferable embodiments, it will be understood by one of ordinary skill in the art that various modifications can be made without departing from the spirit and the scope of the disclosure, as set forth in the appended claims.

What is claimed is:

1. A frequency-to-voltage converter comprising:
    a calculation module receiving a frequency signal and calculating a rotational speed signal according to the frequency signal;
    a quantification module coupled with the calculation module and receiving the rotational speed signal, wherein the quantification module quantifies the rotational speed signal according to a quantification equation and generates a digital quantified signal;
    a signal processing module coupled with the quantification module, receiving the digital quantified signal, and converting the digital quantified signal into a digital voltage signal; and
    a rotary encoder coupled with the calculation module, wherein the rotary encoder detects the rotation of a rotor and generates the frequency signal having a plurality of pulses.

2. The frequency-to-voltage converter as claimed in claim 1, further comprising a digital-to-analog converter coupled with the signal processing module, receiving the digital voltage signal from the signal processing module, converting the digital voltage signal into an analogous voltage signal, and outputting the analogous voltage signal.

3. The frequency-to-voltage converter as claimed in claim 1, wherein each of the plurality of pulses is a square wave having a rising edge, wherein the calculation module calculates the rotational speed signal based on a time difference between the rising edges of two adjacent square waves of the frequency signal.

4. A frequency-to-voltage converter comprising:
    a calculation module receiving a frequency signal and calculating a rotational speed signal according to the frequency signal;
    a quantification module coupled with the calculation module and receiving the rotational speed signal, wherein the quantification module quantifies the rotational speed signal according to a quantification equation and generates a digital quantified signal; and
    a signal processing module coupled with the quantification module, receiving the digital quantified signal, and converting the digital quantified signal into a digital voltage signal,
    wherein the quantification equation is expressed as:

$$n' = \frac{C}{n_{max}} \times n,$$

wherein n' represents the digital quantified signal, n represents the rotational speed signal, $n_{max}$ represents a predicted maximum value of the rotational speed signal, and "C" represents a constant.

5. The frequency-to-voltage converter as claimed in claim 4, further comprising a digital-to-analog converter coupled with the signal processing module, receiving the digital voltage signal from the signal processing module, converting the digital voltage signal into an analogous voltage signal, and outputting the analogous voltage signal.

6. A frequency-to-voltage converter comprising:
   a calculation module receiving a frequency signal and calculating a rotational speed signal according to the frequency signal;
   a quantification module coupled with the calculation module and receiving the rotational speed signal, wherein the quantification module quantifies the rotational speed signal according to a quantification equation and generates a digital quantified signal; and
   a signal processing module coupled with the quantification module, receiving the digital quantified signal, and converting the digital quantified signal into a digital voltage signal, wherein the signal processing module comprises a register unit and a signal generation unit coupled with the register unit, wherein the register unit receives and stores the digital quantified signal, and wherein the signal generation unit retrieves the digital quantified signal from the register unit, and converts the digital quantified signal into the digital voltage signal.

7. The frequency-to-voltage converter as claimed in claim 6, wherein the signal processing module further comprises a delay circuit coupled with the signal generation unit, wherein the delay circuit has a delay time, and wherein the delay circuit controls the signal generation unit to retrieve the digital quantified signal from the register unit based on the delay time.

8. The frequency-to-voltage converter as claimed in claim 7, wherein the register unit has a sampling rate which is a reciprocal of the delay time.

9. The frequency-to-voltage converter as claimed in claim 6, further comprising a digital-to-analog converter coupled with the signal processing module, receiving the digital voltage signal from the signal processing module, converting the digital voltage signal into an analogous voltage signal, and outputting the analogous voltage signal.

* * * * *